(12) United States Patent
Heo

(10) Patent No.: US 8,528,750 B2
(45) Date of Patent: Sep. 10, 2013

(54) CASSETTE FOR LOADING SUBSTRATE

(75) Inventor: Kwon Soo Heo, Gyeonggi-do (KR)

(73) Assignee: Hydis Technologies Co., Ltd., Gyeonggi-do (KR)

( * ) Notice: Subject to any disclaimer, the term of this patent is extended or adjusted under 35 U.S.C. 154(b) by 261 days.

(21) Appl. No.: 12/972,843

(22) Filed: Dec. 20, 2010

(65) Prior Publication Data
US 2012/0080354 A1 Apr. 5, 2012

(30) Foreign Application Priority Data

Oct. 1, 2010 (KR) .......................... 10 2010 0096061

(51) Int. Cl.
*A47G 19/08* (2006.01)
*B65D 85/00* (2006.01)

(52) U.S. Cl.
USPC ........................................ 211/41.18; 206/710

(58) Field of Classification Search
USPC ................ 211/41.17, 41.18, 26, 26.2, 41.12, 211/49.1, 182; 312/265.1–265.4, 223.1, 312/216; 206/1.5, 710–715, 832
See application file for complete search history.

(56) References Cited

U.S. PATENT DOCUMENTS

| | | | | |
|---|---|---|---|---|
| 3,599,234 A * | 8/1971 | Andreini et al. | ............... | 361/802 |
| 5,806,945 A * | 9/1998 | Anderson et al. | .......... | 312/265.3 |
| 6,186,344 B1 * | 2/2001 | Park et al. | ................... | 211/41.1 |
| 7,051,887 B2 * | 5/2006 | Huang et al. | ................. | 211/183 |
| 7,225,934 B2 * | 6/2007 | Shon et al. | ................. | 211/41.18 |
| 7,246,708 B2 * | 7/2007 | Chuang et al. | ............. | 211/41.18 |
| 7,334,690 B2 * | 2/2008 | Huang et al. | ............... | 211/41.18 |
| 7,347,334 B2 * | 3/2008 | Thorn et al. | ................ | 211/41.12 |
| 7,728,225 B2 * | 6/2010 | Anderson et al. | ............... | 174/50 |
| 7,964,793 B2 * | 6/2011 | Anderson et al. | ............... | 174/50 |
| 8,281,940 B2 * | 10/2012 | Fan | ................... | 211/26 |
| 2003/0056331 A1 * | 3/2003 | Garner | ........................... | 16/374 |
| 2004/0007951 A1 * | 1/2004 | Holighaus et al. | ......... | 312/265.4 |
| 2004/0069727 A1 * | 4/2004 | Huang et al. | ................. | 211/41.1 |
| 2004/0069728 A1 * | 4/2004 | Huang et al. | ............... | 211/41.18 |

(Continued)

FOREIGN PATENT DOCUMENTS

| | | |
|---|---|---|
| JP | 9216685 A | 8/1997 |
| KR | 19980070656 A | 4/2001 |
| KR | 20040007294 | 1/2004 |

OTHER PUBLICATIONS

Abstract for KR20070058229, 2 pages, Jun. 8, 2007.

*Primary Examiner* — Joshua J Michener
*Assistant Examiner* — Devin Barnett
(74) *Attorney, Agent, or Firm* — Dority & Manning, P.A.

(57) ABSTRACT

Disclosed is a cassette for loading a substrate, which includes a cassette main body which includes upper and lower frames spaced apart at upper and lower sides, a plurality of internal support bars for supporting the substrate, side frames provided at opposite sides of the upper and lower frames and forms a box shape to internally receive the substrate; a center frame which includes a plurality of internal support bars for supporting the substrate and is vertically disposed in a back of the upper and lower frames; and a connecting member which is provided between the center frame and the cassette main body and detachably connects the center frame to the cassette main body, wherein the connecting member comprises a first fixing unit fixed to the cassette main body, and a second fixing unit fixed to the center frame and detachably coupled to the first fixing unit, the first fixing unit being installed at each of a front and a back of the cassette main body.

7 Claims, 14 Drawing Sheets

(56) References Cited

U.S. PATENT DOCUMENTS

| | | |
|---|---|---|
| 2004/0164035 A1* | 8/2004 | Jang ........................... 211/41.14 |
| 2006/0220506 A1* | 10/2006 | Irmer et al. ................. 312/265.3 |
| 2006/0226094 A1* | 10/2006 | Cho et al. ................... 211/41.18 |
| 2006/0231515 A1* | 10/2006 | Chou ........................... 211/41.18 |
| 2007/0210686 A1* | 9/2007 | Adducci et al. ............. 312/265.2 |
| 2010/0224523 A1* | 9/2010 | Yuasa et al. .................... 206/454 |
| 2012/0240354 A1* | 9/2012 | Heninger ........................ 16/374 |

* cited by examiner

CASSETTE FOR LOADING SUBSTRATE

CROSS-REFERENCE TO RELATED APPLICATION

This application claims priority to and the benefit of Korean Patent Application No, 10-2010-0096061 filed in the Korean Intellectual Property Office on Oct. 1, 2010, the entire contents of which are incorporated herein by reference.

BACKGROUND OF THE INVENTION (a) Field of the Invention

The present invention relates to a cassette for loading a substrate, and more particularly, to a cassette for loading a substrate, in which a direction of taking in and out the substrate for a flat panel display device can be selectively changed.

(b) Description of the Related Art

In general, a liquid crystal display (LCD) device, a plasma display panel (PDP) device, or the like flat panel display device essentially includes a flat display panel that a pair of transparent substrates are faced and attached with each other with an intrinsic fluorescent or polarization layer sandwiched therebetween. Such a panel is configured by many times repetitively undergoing a deposition process for forming a thin film of a predetermined material, a photolithography process, and an etching process. Besides, there are involved various processes such as cleaning, assembling, cutting, etc.

To undergo these respective processes, the substrates are carried and supplied to equipment corresponding to each process. At this time, a cassette is used for loading a plurality of substrates in order to reduce time and effort to be taken in carrying and keeping the substrates. The existing cassette forms a minimal unit of keeping and carrying the substrates in manufacturing the flat panel display device.

FIG. 1 is a perspective view of a general cassette for loading a substrate.

As shown therein, a cassette for loading a substrate (hereinafter, referred to as a 'cassette: C') includes top and bottom plates 14 and 16 forming the top and bottom horizontal surfaces of the ceiling and the floor; an entrance 12 opened by connecting corresponding edges of the top and bottom plates 14 and 16; opposite lateral surfaces 18, 20 facing each other with respect to the front entrance 12 so as to form an interior space for loading the substrate; and a back surface 22 opposite to the entrance 12.

The opposite lateral surfaces 18, 20 and the back surface 22 include a plurality of frame bars 32*a*, 32*b*, 32*c*, 34*a*, 34*b*, 34*c* and a support frame bar 36. The frame bars 32*a*, 32*b*, 32*c*, 34*a*, 34*b*, 34*c* include a plurality of side slot pins 42 at regular intervals, which horizontally protrude from insides thereof in a direction of facing each other. The support frame bar 36 forming the back surface 22 of the cassette 10 includes a plurality of support bars 46 at the same intervals as the side slot pins 42, which horizontally protrude toward the entrance 12. At this time, one end of the support bar 46 is formed with a peak 44 for not direct contact but point contact with the substrate.

Thus, the substrate (not shown) are supported at opposite edges by the side slot pins 42 provided at opposite sides and corresponding to each other, and transversely supported by the support bar 46, so that they can be loaded according to respective layers.

The substrate to be kept in the cassette C is taken in and out as follows. First, as shown in (a) of FIG. 2, the substrates G carried from a carrying line L1 of the preceding process are loaded to the inside of the cassette C by a gantry robot R. As shown therein, an end part of the substrate G facing a front of the carrying line L1 is loaded to face toward a front opening of the cassette C, and sent to the following process by a cassette carrying device (not shown)

Then, shown in (b) of FIG. 2, the substrate G loaded to the cassette C as is taken out by the gantry robot R through the front opening of the cassette C and sent to a carrying line L2 of the following process. However, in the case that the substrate G is directly carried by the gantry robot R from the cassette C to the carrying line L1 of the following process, a front and back direction of the substrate G is reversed because the end part of the substrate G facing the front opening of the cassette C faces a back of the carrying line L2 of the following process.

As shown therein, a turn table T for a 180-degree turn of the substrate G is provided between the cassette C and the following carrying line L2, and the glaess G taken out from the cassette C by the gantry robot R is put on the turn table T. Then, the turn table T is turn 180 degrees, and the substrate G is sent by the gantry robot R from the turn table T to the carrying line L2 of the following process. Accordingly, there is a problem in that the number of processes increases.

Further, the substrate G may be handled for the 180-degree turn by a worker of a processing line. However, in this case, the substrates may be misaligned and be easily damaged.

SUMMARY OF THE INVENTION

Accordingly, the present invention is conceived to solve the forgoing problems, and an aspect of the present invention is to provide a cassette for loading a substrate, in which a center frame supporting a center of the substrate at one side is selectively installed in a front or back side of a cassette main body, so that a direction of taking in and out the substrate can be selectively changed.

Another aspect of the present invention is to provide a cassette for loading a substrate, in which a support bar of a center frame supporting a center of the substrate at one end side is attached and detached as being spaced apart from the substrate, so that the substrate can be prevented from damage.

Still another aspect of the present invention is to provide a cassette for loading a substrate, in which a support bar of a center frame is detached from a cassette main body beyond the cassette main body by rotating while being kept horizontal, so that the substrate can be prevented from damage when the center frame is detached.

Yet another aspect of the present invention is to provide a cassette for loading a substrate, in which a center frame and a lever are prevented from discretionarily released from a state being positioned in a fixing direction.

An exemplary embodiment of the present invention provides a cassette for loading a substrate, which includes a cassette main body which includes upper and lower frames spaced apart at upper and lower sides, a plurality of internal support bars for supporting the substrate, side frames provided at opposite sides of the upper and lower frames and forms a box shape to internally receive the substrate; a center frame which includes a plurality of internal support bars for supporting the substrate and is vertically disposed in a back of the upper and lower frames; and a connecting member which is provided between the center frame and the cassette main body and detachably connects the center frame to the cassette main body, wherein the connecting member may include a first fixing unit fixed to the cassette main body, and a second fixing unit fixed to the center frame and detachably coupled to the first fixing unit, the first fixing unit being installed at each of a front and a back of the cassette main body.

The cassette for loading a substrate may further include a moving-up/down member provided between the center frame and the connecting member and making the center frame move up and down in a vertical direction.

The moving-up/down member may include a support frame vertically disposed between the upper frame and the lower frame, and a control unit provided in the support frame and controlling a moving-up/down operation of the center frame.

The moving-up/down member may include a guide member provided between the support frame and the center frame and guiding the center frame to vertically move on the support frame.

The control unit may include a lever pivotally installed in the support frame, an operation shaft vertically moving up and down as the lever is pivoted, and a connecting bracket connecting the operation shaft and the center frame.

The lever may include a toggle clamp.

The support frame may include a first stopper that fixes a locking position of the lever to the support frame.

The support frame pivotally connected to the cassette main body through the connecting member may include a second stopper that fixes the support frame and the cassette main body and prevents the support frame from discretionarily pivoting.

The first fixing unit and the second fixing unit may be respectively formed with a pivot shaft and an insertion hole for the pivot shaft, and assembled to be pivotable with respect to each other.

DETAILED DESCRIPTION OF THE EMBODIMENTS

Figure 1:
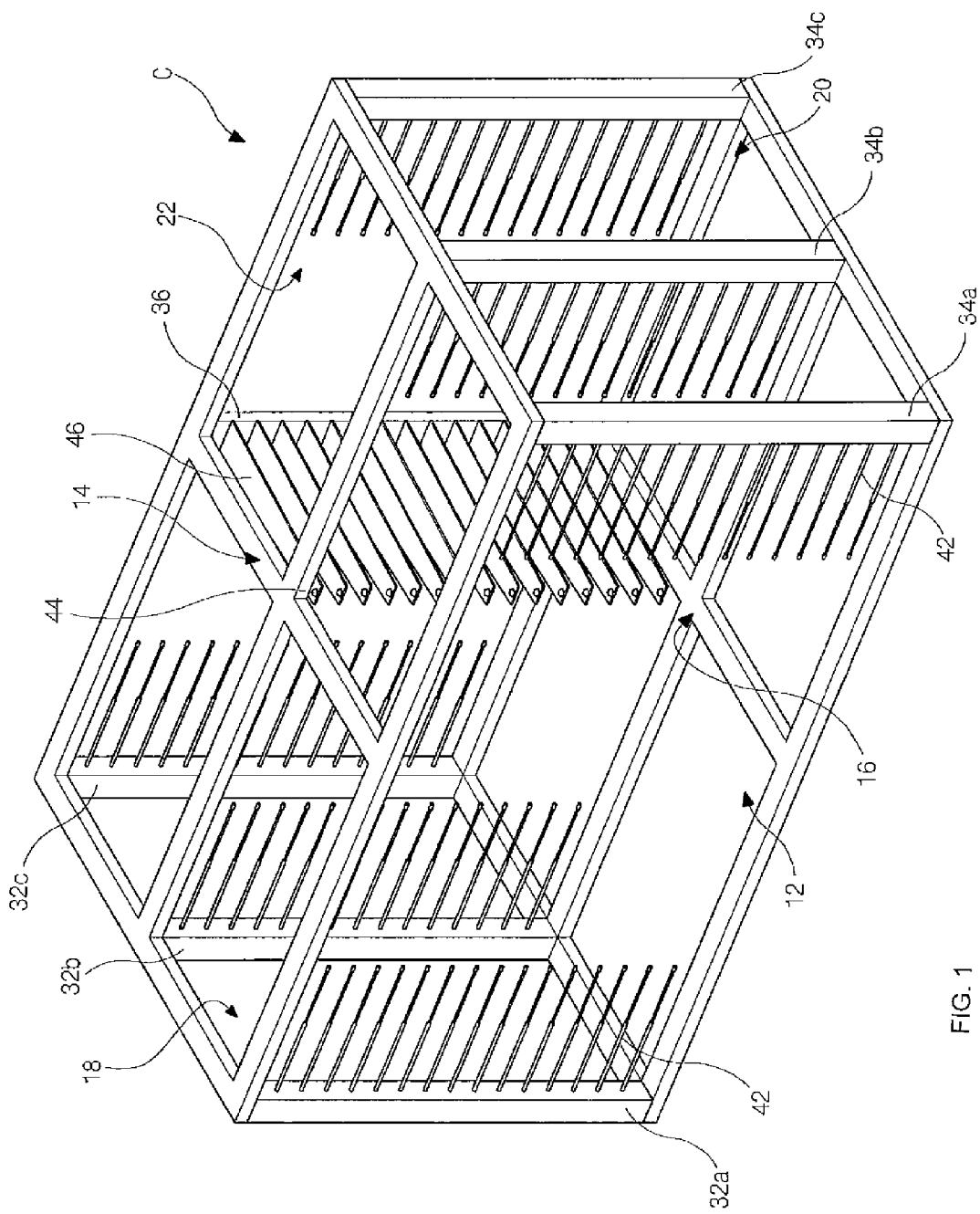
FIG. 1 is a perspective view of a conventional cassette for loading substrates.
Figure 2:
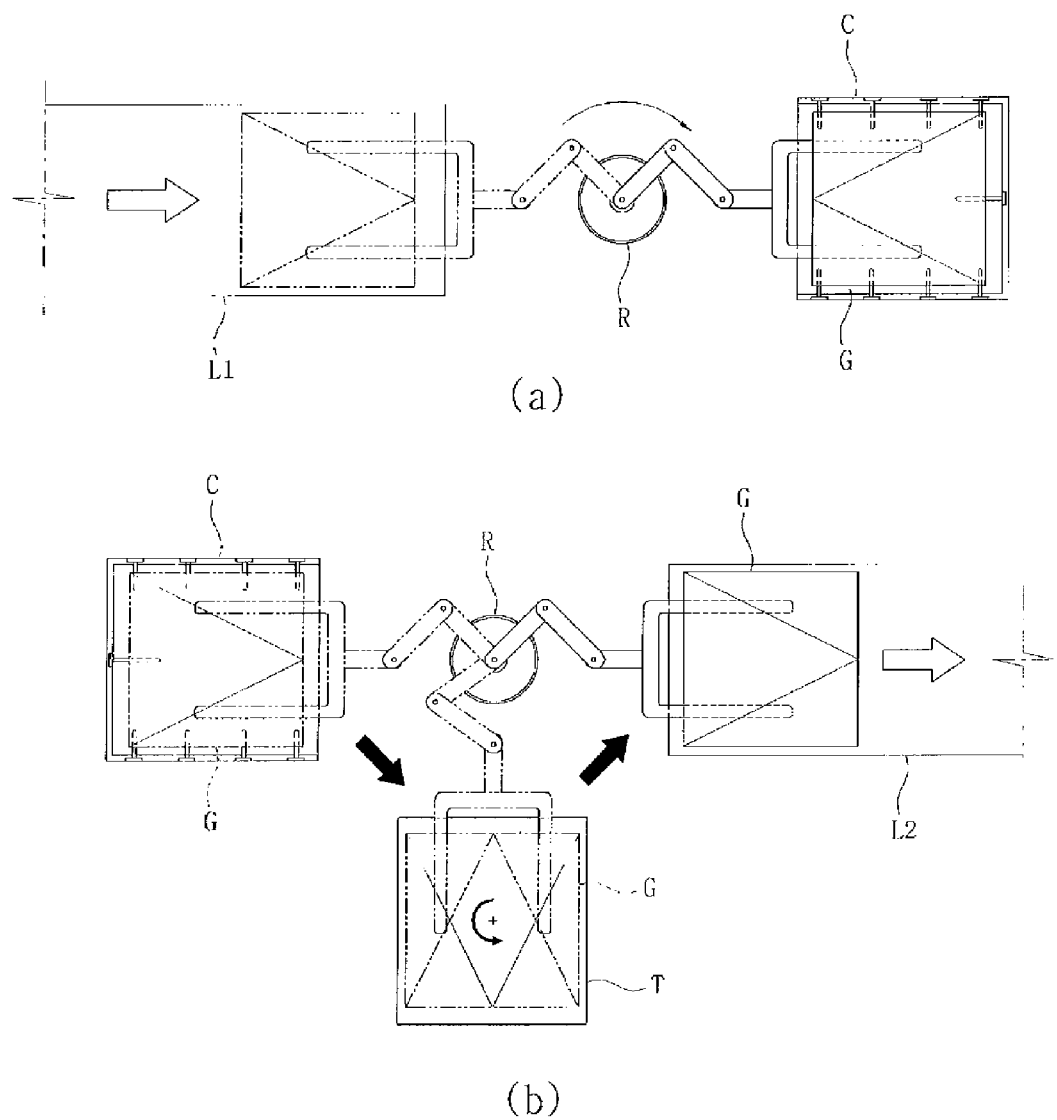
FIG. 2 is a configuration view showing that the conventional cassette for loading substrates is installed in a processing line.

Prior to description, elements will be representatively explained in an embodiment and only different configurations will be described in another embodiment, in which like reference numerals refer to like elements throughout the embodiments.

Hereinafter, a cassette for loading a substrate according to a first exemplary embodiment of the present invention will be described with reference to the accompanying drawings.

Figure 3:
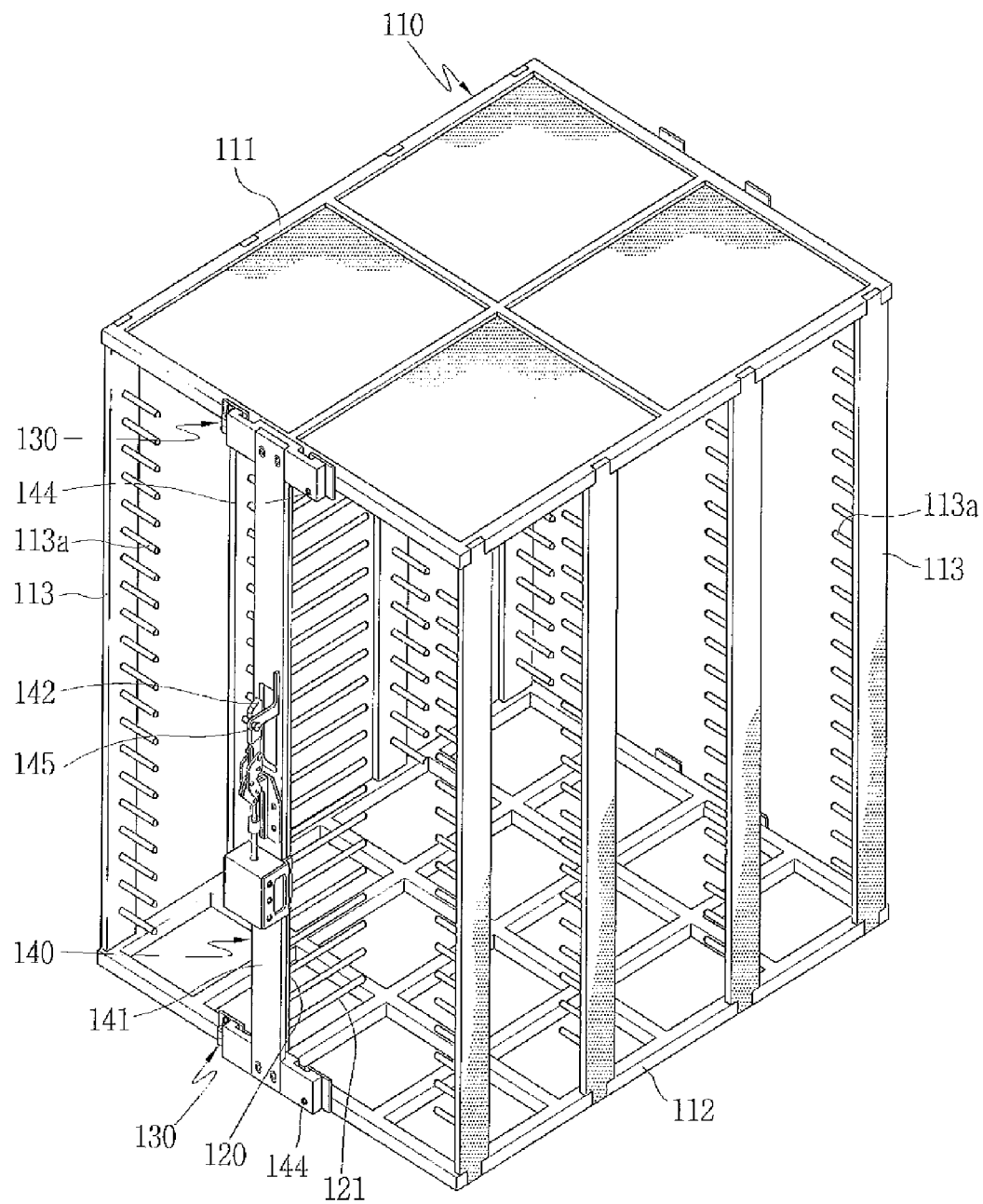
FIG. 3 is a perspective view of a cassette for loading a substrate according to an exemplary embodiment of the present invention.
Figure 4:
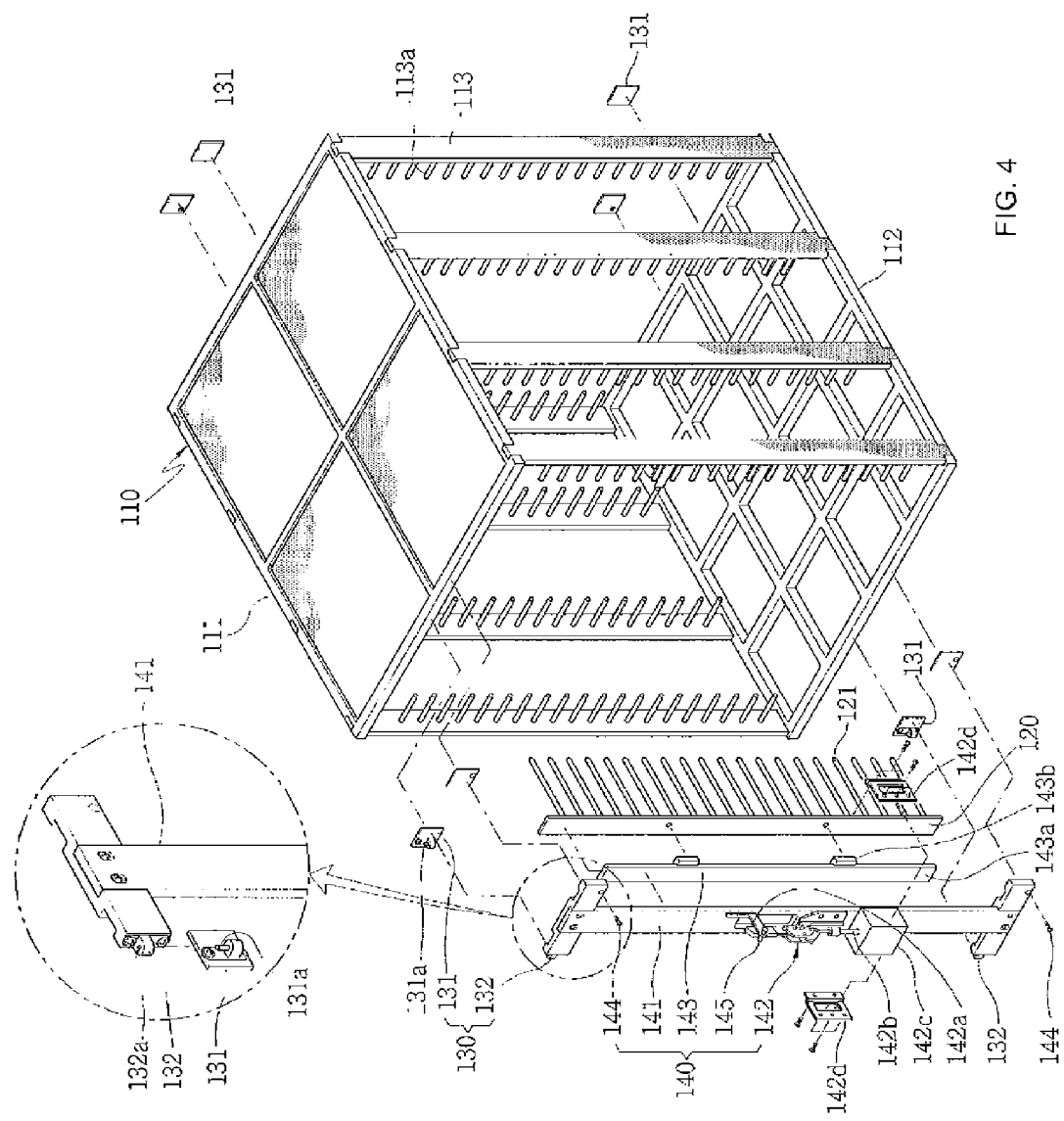
FIG. 4 is an exploded perspective view of the cassette for loading a substrate according to an exemplary embodiment of the present invention.

Among the accompanying drawings, FIG. 3 is a perspective view of a cassette for loading a substrate according to an exemplary embodiment of the present invention, and FIG. 4 is an exploded perspective view of the cassette for loading a substrate according to an exemplary embodiment of the present invention.

As shown therein, the cassette for loading a substrate according to an exemplary embodiment of the present invention includes a cassette main body 110, a center frame 120, a connecting member 130 and a moving-up/down member 140.

The cassette main body 110, in which a plurality of substrates G is received and loaded, includes an upper frame 111 and a lower frame 112 facing and being spaced from each other, and side frames 113 vertically placed at opposite sides between the upper frame 111 and the lower frame 112, thereby forming a shape opened frontward and backward. The side frame 113 includes a plurality of support bars 113a internally formed at regular intervals and supporting the substrate G. The support bar 113a serves to support both sides of the substrate G so that the substrate G can be easily loaded.

The center frame 120 is internally formed with a plurality of support bars 121 supporting the substrate G, and is vertically provided in either of a front opening side or a back opening side of the cassette main body 110. The support bar 121 is horizontally extended from an inside of the center frame 120 toward a taking-in/out direction of the cassette main body 110, which is an essential member needed for preventing a large-sized substrate G from bending or sagging when the large-sized substrate G is loaded.

The connecting member 130 is provided between the center frame 120 and the cassette main body 110 and detachably connects the center frame 120 to the cassette main body 110, which includes a first fixing unit 131 fixed to each of a front and a back of the upper frame 111 and the lower frame 112, and a second fixing unit 132 fixed to the center frame 120 and detachably coupled to the first fixing unit 131. Also, the first fixing unit 131 includes a pivot shaft 131a vertically formed upward, and the second fixing unit 131 includes an insertion hole 132a in which the pivot shaft 131a is inserted.

The moving up/down member 140 is provided between the center frame 120 and the connecting member 130, which includes a support frame 141 vertically disposed between the upper frame 111 and the lower frame 112 and coupled to the second fixing unit 132 at one sides of upper and lower ends thereof, and a control unit 142 provided in the support frame 141 and controlling the center frame 120 to move up and down, and a guide member 143 placed between the support frame 141 and the center frame 120 and guides the center frame 120 to move up and down by the control unit 142.

The control unit 142 includes a lever 142a pivotally installed in the support frame 141, an operation shaft 142b linked to the lever 142a and vertically moving up and down as the lever 142a is pivoted, a fixed block 142c fixed to the operation shaft 142b, and a connecting bracket 142d connecting the fixed block 142c and the center frame 120. Also, the lever 142a is installed so that the operation shaft 142b moves up as the lever 142a is operated in a locking direction and the operation shaft 142b moves down as the lever 142a is operated in a releasing direction. Further, the lever 142a may be achieved by a push/pull-type toggle clamp to prevent the lever 142a from being discretionarily released from a locked state.

The support frame 141 is provided with a first stopper 144 fixing the support frame 141 and the cassette main body 110 and preventing the support frame 141 from being discretionarily pivoted, and a second stopper 145 fixing the lever 142a to the support frame 141 at a locking position. In this exemplary embodiment, it will be described for example that the first stopper 144 includes a locking bolt selectively fixed to the cassette main body 110 by passing through the support frame 141, and the second stopper 145 fixes a position of the lever 142a by supporting an end part of the lever 142a in the state that the lever 142 is pivoted upward.

The guide member 143 includes a guide rail 143a, and a slider 143b coupled to the guide rail 143a and sliding in a lengthwise direction of the guide rail 143a. In this exemplary embodiment, it will be described for example that the guide rail 143a is fastened to the support frame 141 and the slider 143b is fastened to the center frame 120.

In the foregoing exemplary embodiment, the support bar 113a and the support bar 121 are shaped like a bar to receive a large-sized substrate G, but not limited thereto. Alternatively, in the case of receiving a small-sized substrate G, an end part of the substrate G may be inserted in and supported by a slot respectively formed on the insides of the side frame 113 and the center frame 120.

From now on, an assembly structure of the cassette for loading a substrate according to the first exemplary embodiment of the present invention will be described.

Figure 5:
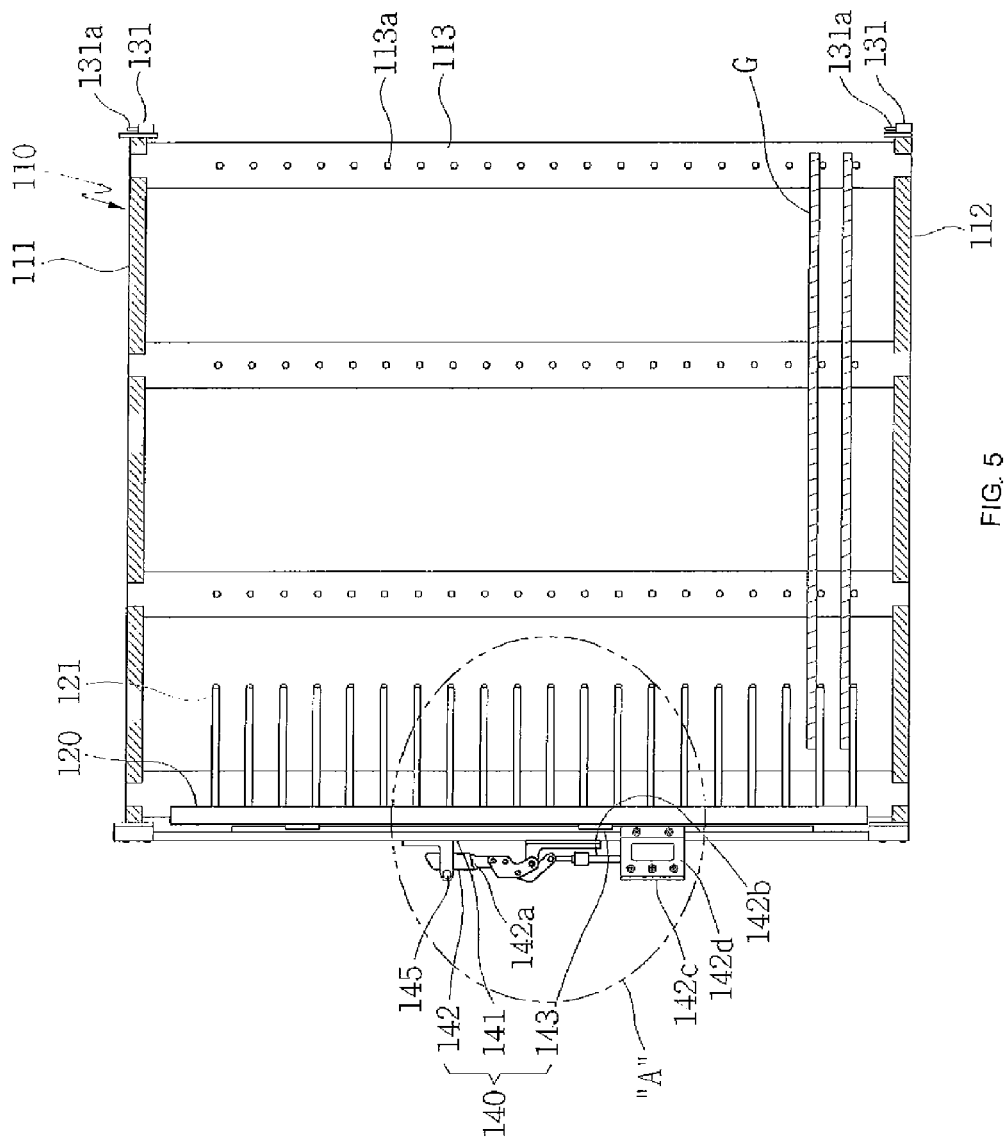
FIG. 5 is a lateral cross-section view of the cassette for loading a substrate according to an exemplary embodiment of the present invention.
Figure 6:
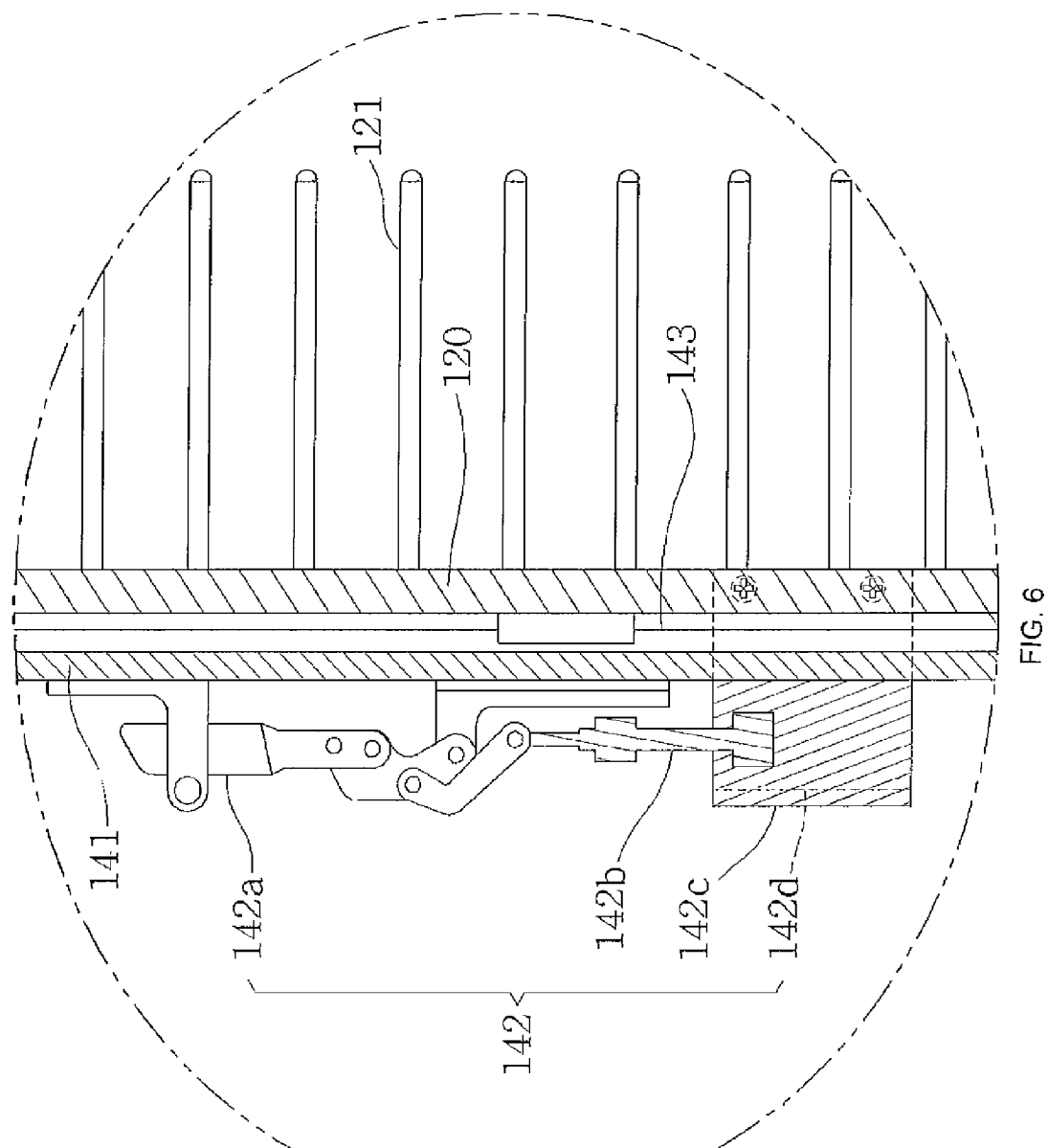
FIG. 6 is an enlarged cross-section view of an "A" part in FIG. 5.
Figure 7:
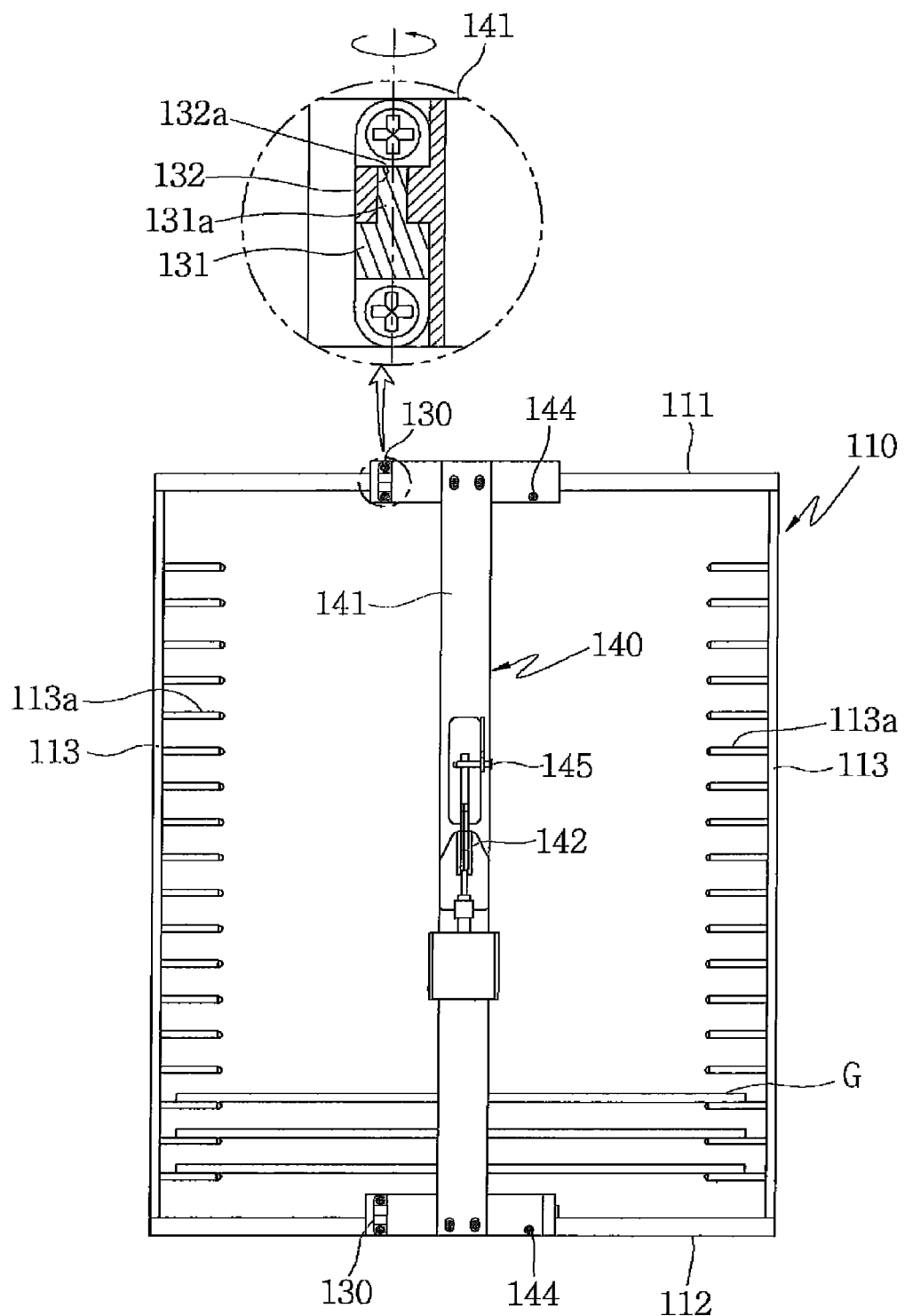
FIG. 7 is a front view of the cassette for loading a substrate according to an exemplary embodiment of the present invention.
Figure 8:
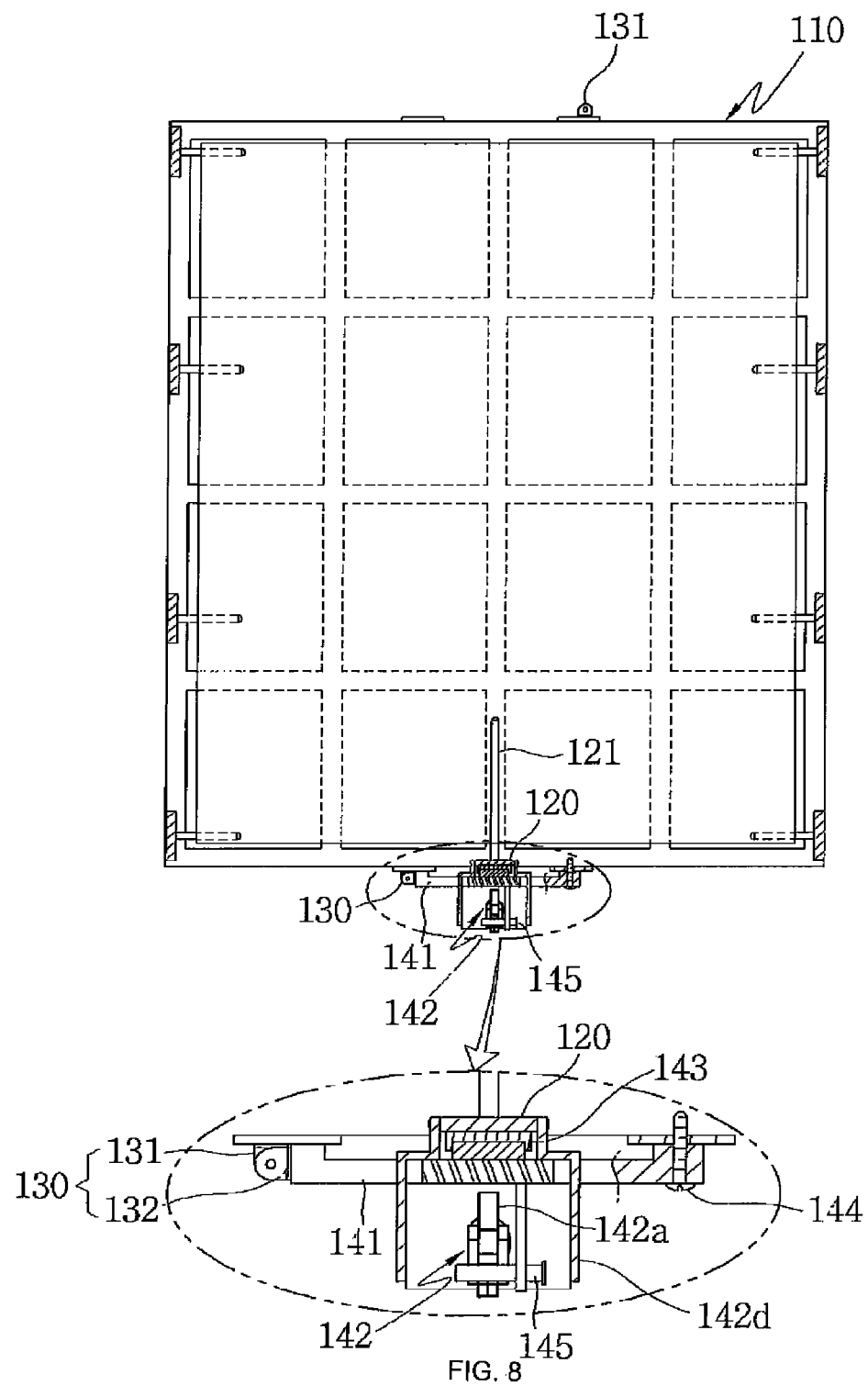
FIG. 8 is a plan cross-section view of the cassette for loading a substrate according to an exemplary embodiment of the present invention.

Among the accompanying drawings, FIG. 5 is a lateral cross-section view of the cassette for loading a substrate according to an exemplary embodiment of the present invention, FIG. 6 is an enlarged cross-section view of an "A" part in FIG. 5, FIG. 7 is a front view of the cassette for loading a substrate according to an exemplary embodiment of the present invention, and FIG. 8 is a plan cross-section view of the cassette for loading a substrate according to an exemplary embodiment of the present invention.

As shown therein, the cassette main body 110 is shaped like a box opened frontward and backward, in which both sides of the upper and lower frames 111 and 112 facing each other at up and down sides are connected by the plurality of vertically-disposed side frames 113. The middles at the both sides of the substrate G loaded to the inside of the cassette main body 110 are respectively supported by the plurality of support bars 113a protruding from the inside of the side frame 113.

The support bar 121 of the center frame 120 installed in a rear middle of the cassette main body 110 supports the middle of the back side of the substrate G loaded into the cassette main body 110, thereby preventing the substrate G from sagging.

The center frame 120 is assembled detachably from the cassette main body 110 by the connecting member 130 provided between the center frame 120 and the cassette main body 110, so that it can be selectively installed to either of the front or the back of the cassette main body 110.

That is, the second fixing unit 132 fastened to the center frame 120 is coupled to the first fixing unit 131 fastened to the cassette main body 110, so that the center frame 120 can be detachably coupled to the cassette main body 110. As described above, because the first fixing unit 131 is installed to each of the front and the back of the cassette main body 110, the center frame 120 can be selectively installed to the front or the back of the cassette main body 110.

In particular, the insertion hole 132a of the second fixing unit 132 is put on the pivot shaft 131a of the first fixing unit 131, so that the center frame 120 can be pivoted from the cassette main body 110.

As mentioned above, the connecting members 130 are respectively provided in the upper and lower end parts of the center frame 120 and the cassette main body 110, so that the center frame 120 can be pivoted stably.

Meanwhile, the moving-up/down member 140 is provided between the connecting member 130 and the center frame 120 and guides the center frame 120 to move in a vertical direction, so that the substrate G can be prevented from being damaged due to pivoting of the center frame 120 since the support bar 121 is detached as being spaced apart from the bottom of the substrate G while the center frame 120 is detached.

That is, the second fixing units 132 of the connecting member 130 are respectively fixed to the upper and lower end parts of the support frame 131 disposed in the vertical direction, the center frame 120 is installed in the inside of the support frame 141, and the guide member 143 is provided between the support frame 141 and the center frame 120. Therefore, the center frame 120 is guided to move up and down.

Also, the control unit 142 is provided outside the support frame 141 in order to move the center frame 120 in the vertical direction.

The lever 142a constituting the control unit 142 is pivoted upon a predetermined axis to make the operation shaft 142b placed below the lever 142a move up and down. Here, the fixed block 142c fixed to a lower end part of the operation shaft 142b is linked to the center frame 120 through the connecting bracket 142d, so that the center frame 120 can move up and down in accordance with a pivoting direction of the lever 142a.

Below, an operation of the cassette for loading a substrate, assembled as described above, will be described according to the first exemplary embodiment of the present invention.

Among the accompanying drawings, FIGS. 9 to 13 are operation views showing a process of detaching a center frame from a cassette main body in the cassette for loading a substrate according to an exemplary embodiment of the present invention.

First, it will be described that the center frame 120 installed in a rear side of the cassette main body 110 is detached.

Figure 9:
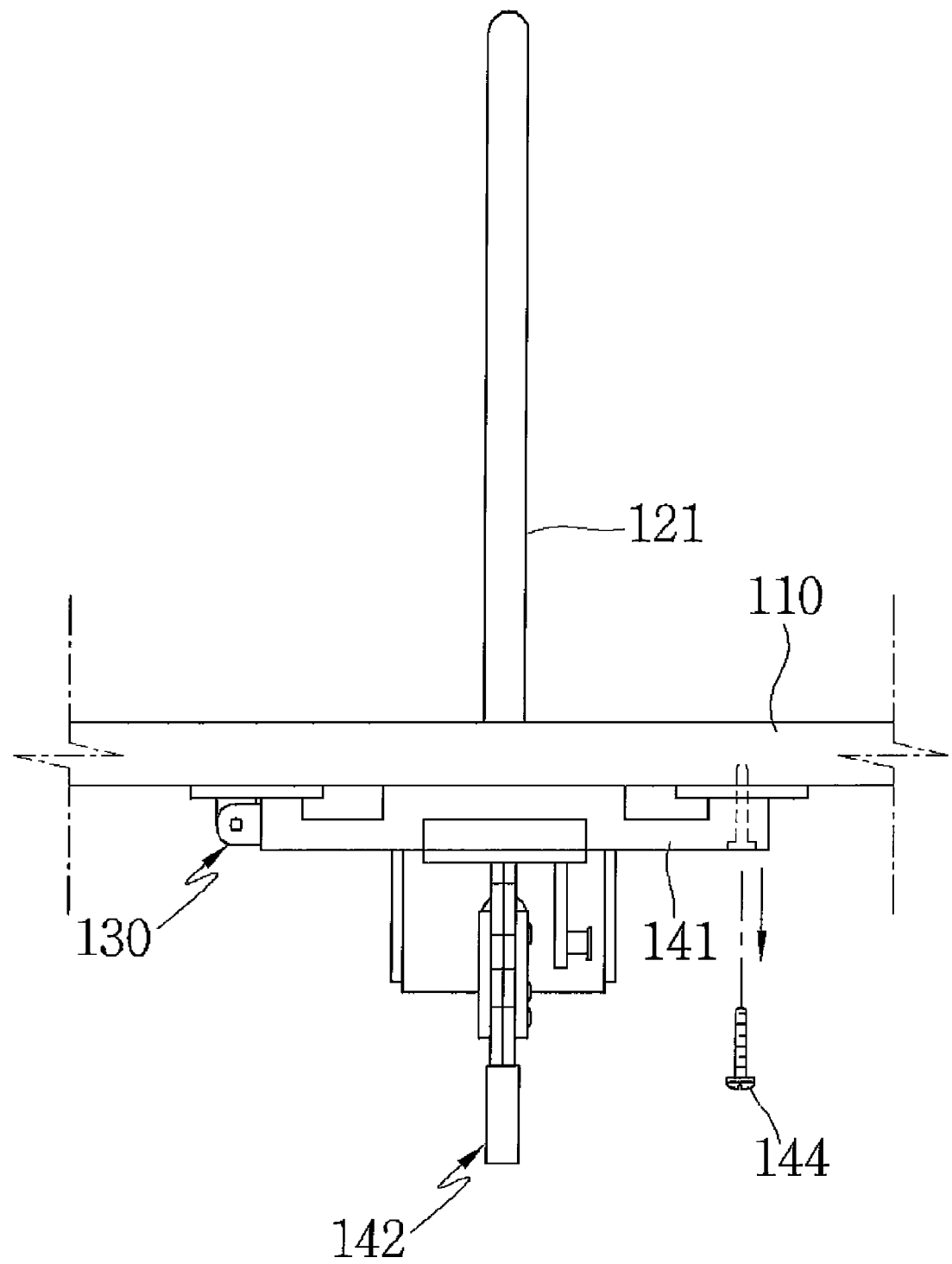
FIGS. 9 to 13 are operation views showing a process of detaching a center frame from a cassette main body in the cassette for loading a substrate according to an exemplary embodiment of the present invention.

As shown in FIG. 9, if the first stopper 144 fixed to the cassette main body 110 by passing through the support frame 141 is released, the support frame 141 is also released so that the support frame 141 can be pivoted upon the pivot shaft 131a of the connecting member 130.

Figure 10:
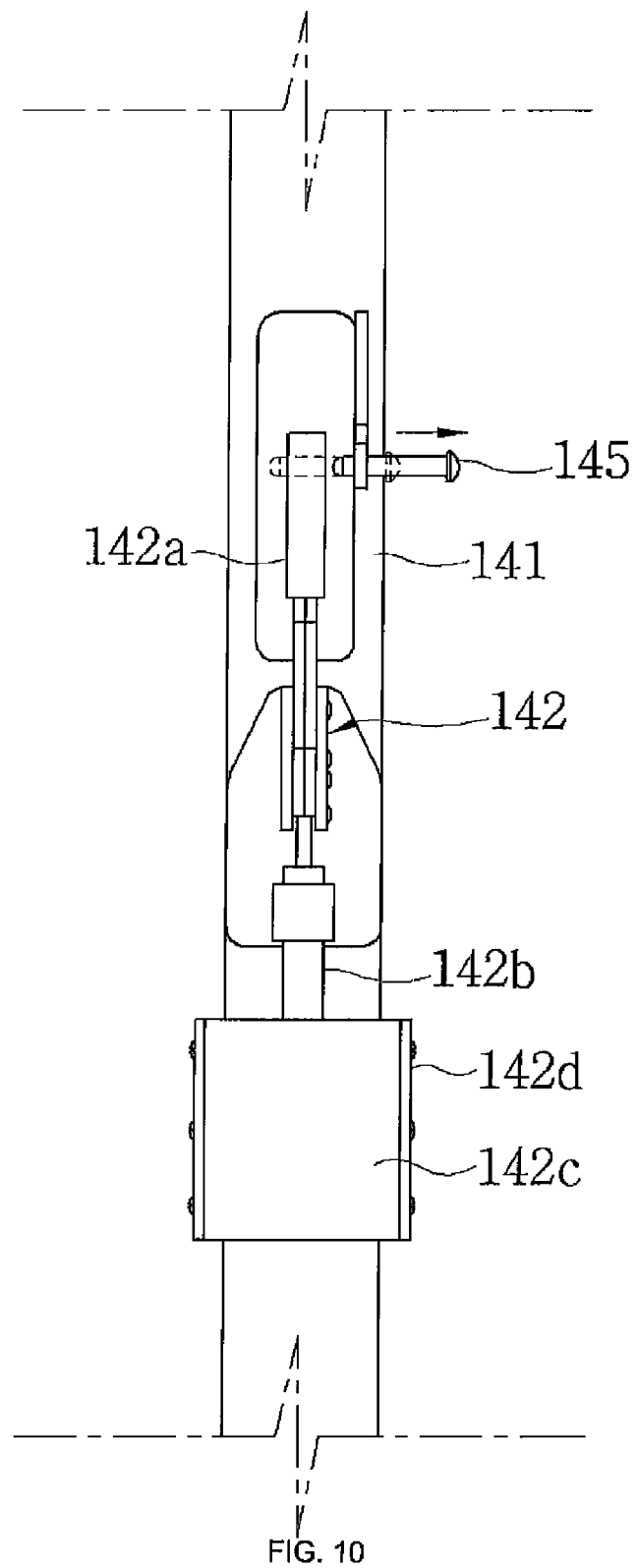

Also, as shown in FIG. 10, if the second stopper 145 fixing the upward pivoted position of the lever 142a is moved in a releasing direction, the lever 142a is released to be pivotable in a downward direction.

Figure 11:
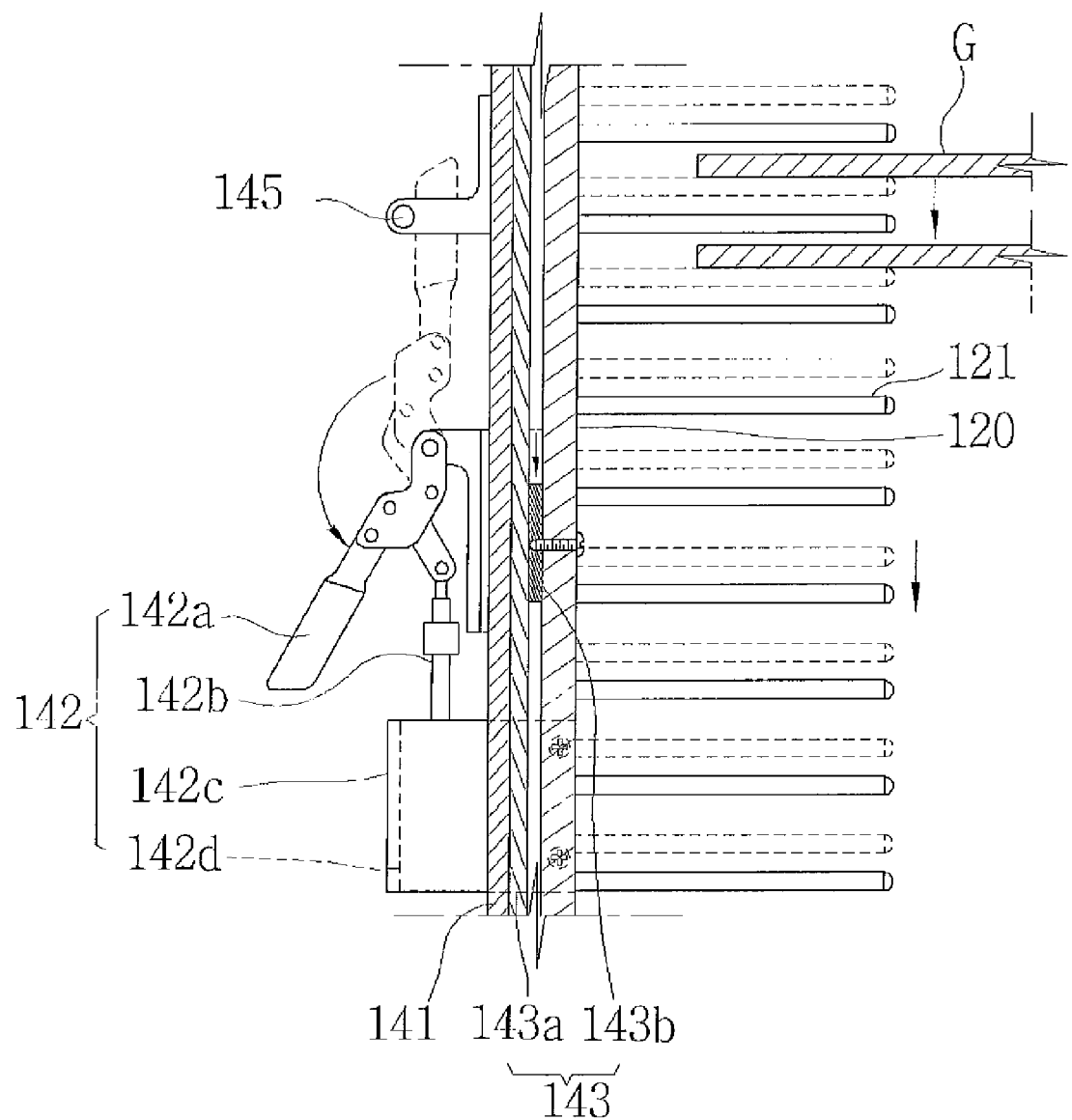

Thus, if the lever 142a is pivoted in the downward direction as shown in FIG. 11 in the state that the lever 142a is released, the operation shaft 142b connecting with the lever 142a and the fixed block 142c fixed to the operation shaft 142b move down in the vertical direction. Further, the center frame 120 connecting with the fixed block 142 moves down interlocking with downward movement of the operation shaft 142, so that the support bar 121 of the center frame 120 can be spaced apart from the bottom of the substrate G by a predetermined distance. At this time, the guide member 143 provided between the center frame 120 and the support frame 141 guides the center frame 120 to move in the vertical direction.

Figure 12:
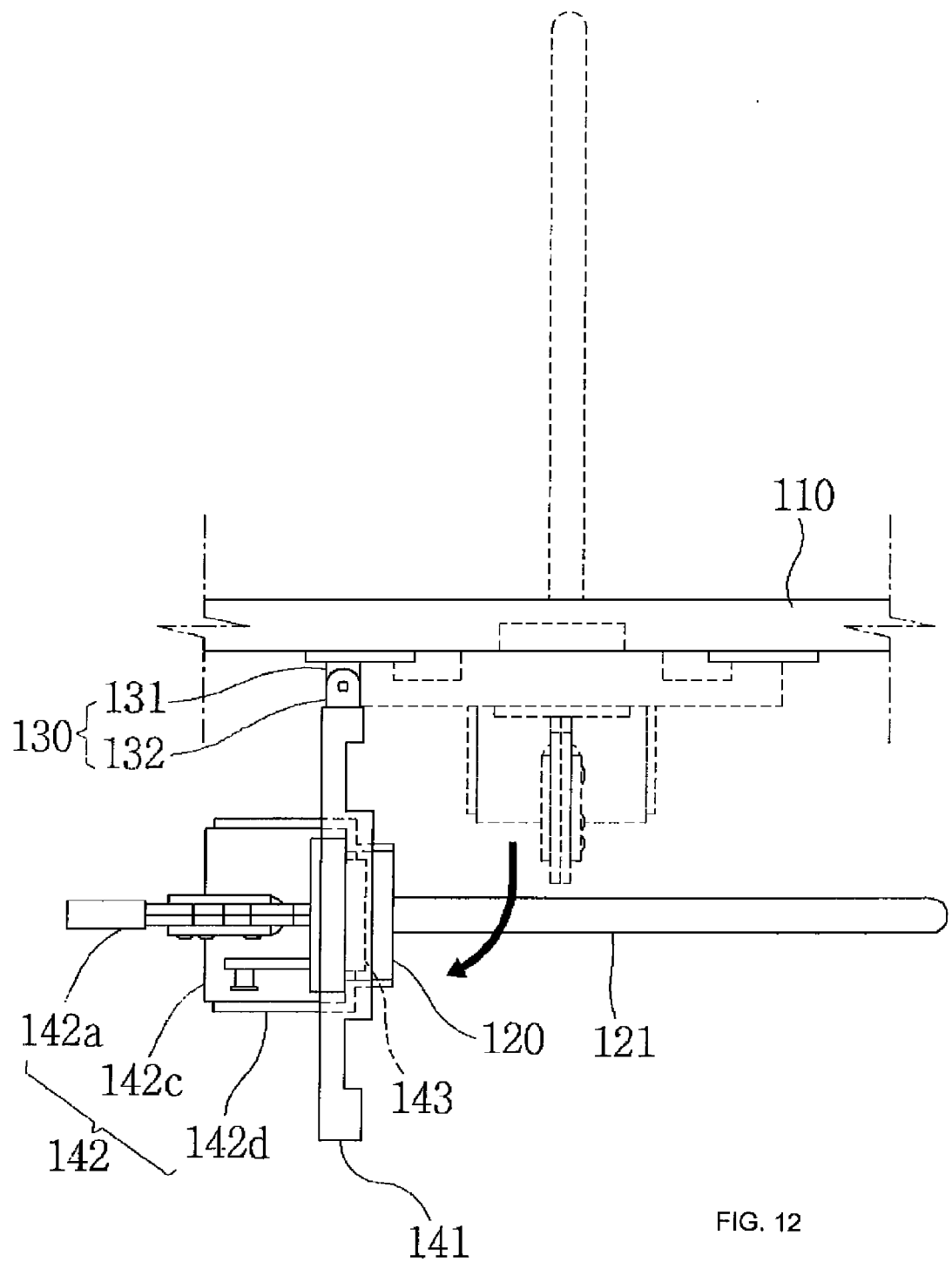

In the state that the support bar 121 is spaced apart from the bottom of the substrate G as described above, if the support frame 141 pivotable from the cassette main body 110 upon the connecting member 130 is pivoted in a clockwise direction as shown in FIG. 12, the support bar 121 of the center frame 120 is detached beyond the cassette main body 110. At this time, the support frame 141 is stably pivoted since the connecting member 130 is installed in each of the upper and lower end parts of the support frame 141. Further, since the support bar 121 of the center frame 120 is horizontally pivoted as being spaced apart from the substrate G, the substrate G is prevented from contact with the support bar 121 while the support bar 121 is detached.

Figure 13:
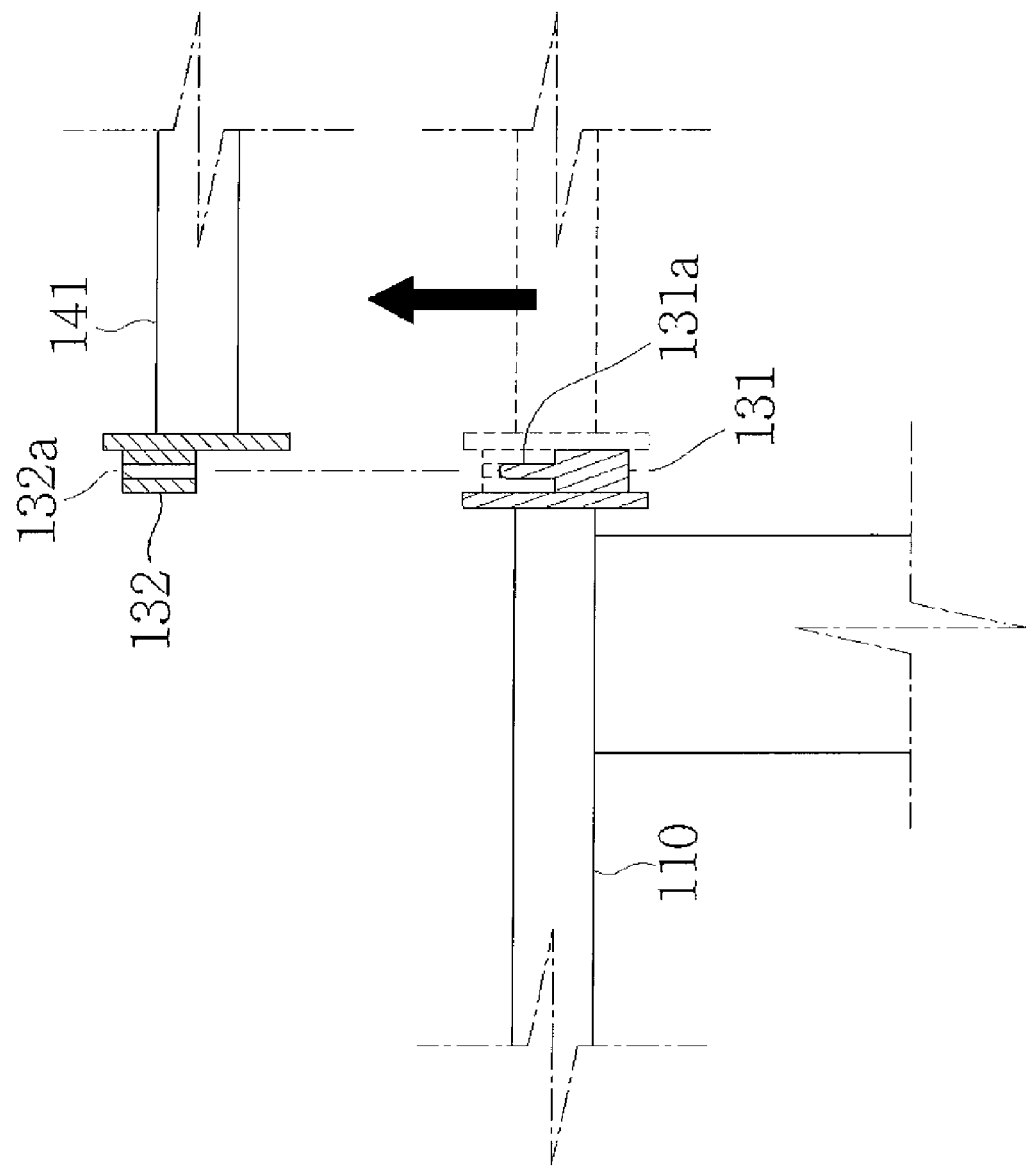

Then, if the support frame 141 is lifted upward as shown in FIG. 13, the insertion hole 132a of the second fixing unit 132 fixed to the support frame 141 is separated from the pivot shaft 131a of the first fixing unit 131 fixed to the cassette main body 110 so that the support frame 141 can be separated from the cassette main body 110.

As mentioned above, after the center frame 120 is detached from the front or back of the cassette main body 110, it can be coupled again to the first fixing unit 131 of the connecting member 130 provided in an opposite end part of the cassette main body 110.

Figure 14:
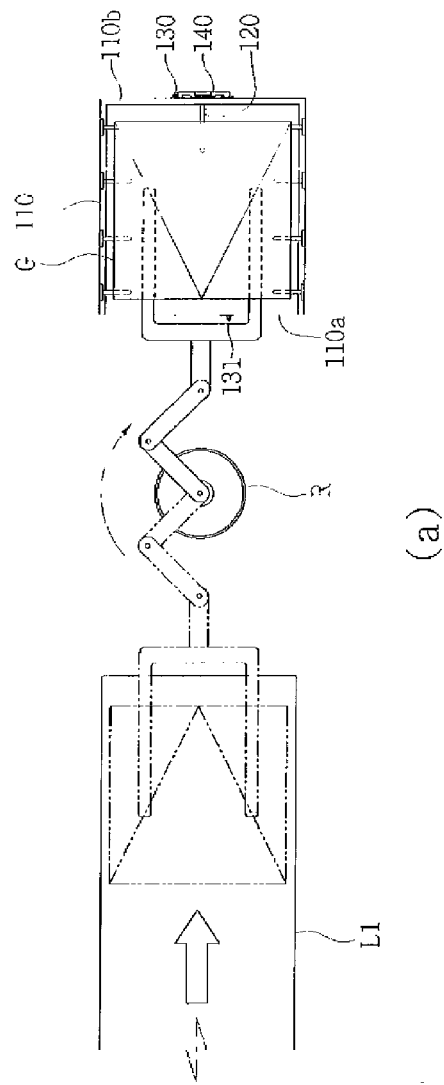
FIG. 14 is a configuration view showing a state that the cassette for loading a substrate is installed in a processing line according to an exemplary embodiment of the present invention.
Figure 14:
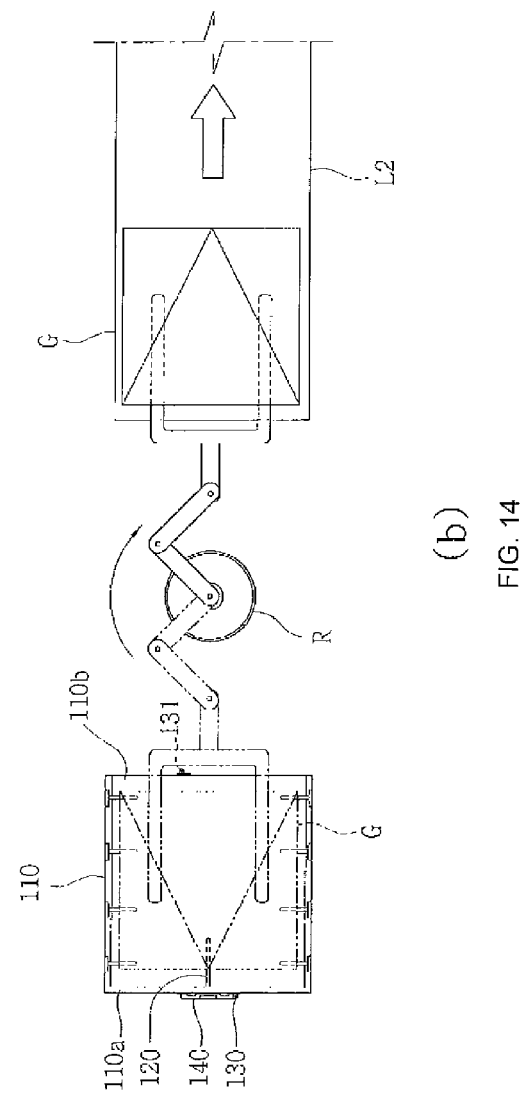

Among the accompanying drawings, FIG. 14 is a configuration view showing a state that the cassette for loading a substrate is installed in a processing line according to an exemplary embodiment of the present invention. As shown in (a) of FIG. 14, a gantry robot R is used to load the substrate G supplied from a carrying line L1 of the preceding process into the inside of the cassette main body 110 via the front opening of the cassette main body 110.

Then, in the state that the substrate G is completely received, as shown in (b) of FIG. 14 the center frame 120 attached to the connecting member 130 at a side of a rear opening 110b of the cassette main body 110 is detached by the foregoing process, and then attached to the connecting member 130 at a side of a front opening 110a and assembled in a reverse order to the detachment. Then, the gantry robot R placed between the following carrying line L2 and the cassette main body 110 takes out the substrate G from the inside of the cassette main body 110 via the rear opening 110b and transfers it to the following carrying line L2.

As described above, the substrate G is inserted toward the front opening 110a of the cassette main body 110 and then taken out from the rear opening 110b of the cassette main body 110, so that the front and back direction of the substrate G is never reversed as opposed to a conventional case and thus a processing flow becomes simplified.

Meanwhile, in the above exemplary embodiment, the substrate G for display is loaded into the cassette main body 110, but not limited thereto. Alternatively, a wafer of a semiconductor process, or the like may be loaded into the cassette main body 110. Further, in the above exemplary embodiment, the center frame 120 is manually detached using the connecting member 130, but not limited thereto. Alternatively, the center frame 120 may be placed in each of the front and back of the cassette main boy 110, and a separate driver (not shown) is used for pivoting and moving up and down the center frame 120 so that the front and back of the cassette main body 110 can be opened, thereby automating the process.

As described above, there is provided a cassette for loading a substrate, in which a center frame supporting a center of the substrate at one side is selectively installed in a front or back side of a cassette main body, so that a direction of taking in and out the substrate can be selectively changed.

Also, there is provided a cassette for loading a substrate, in which a support bar of a center frame supporting a center of the substrate at one end side is attached and detached as being spaced apart from the substrate, so that the substrate can be prevented from damage.

Further, there is provided a cassette for loading a substrate, in which a support bar of a center frame is detached from a cassette main body beyond the cassette main body by rotating while being kept horizontal, so that the substrate can be prevented from damage when the center frame is detached.

Furthermore, there is provided a cassette for loading a substrate, in which a center frame and a lever are prevented from discretionarily released from a state of being positioned in a fixing direction.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A cassette for loading a substrate, comprising
a cassette main body which comprises upper and lower frames spaced apart at upper and lower sides, a plurality of internal support bars for supporting the substrate, and side frames provided at each lateral side of the upper and lower frames and forms a box shape to internally receive the substrate;
a center frame which comprises a plurality of internal support bars for supporting the substrate and is vertically disposed between the upper and lower frames and at a front or back of the cassette main body so that a direction of taking in and out the substrate can be selectively changed;
a connecting member which is provided between the center frame and the cassette main body and detachably connects the center frame to the cassette main body, wherein the connecting member comprises a first fixing unit fixed to the cassette main body, and a second fixing unit fixed to the center frame and detachably coupled to the first fixing unit, the first fixing unit being installed at each of a front and a back of the cassette main body; and
a moving-up/down member provided between the upper frame and lower frame and making the center frame move up and down in a vertical direction, wherein the moving-up/down member comprises a support frame vertically disposed between the upper frame and the lower frame, and a control unit provided in the support frame and controlling a moving-up/down operation of the center frame.

2. The cassette for loading a substrate according to claim 1, wherein the moving-up/down member comprises a guide member provided between the support frame and the center frame and guiding the center frame to vertically move on the support frame.

3. The cassette for loading a substrate according to claim 2, wherein the control unit comprises a lever pivotally installed in the support frame, an operation shaft vertically moving up and down as the lever is pivoted, and a connecting bracket connecting the operation shaft and the center frame.

4. The cassette for loading a substrate according to claim 3, wherein, wherein the lever comprises a toggle clamp.

5. The cassette for loading a substrate according to claim 4, wherein the support frame comprises a first stopper that fixes a locking position of the lever to the support frame.

6. The cassette for loading a substrate according to claim 5, wherein the support frame pivotally connected to the cassette main body through the connecting member comprises a second stopper that fixes the support frame and the cassette main body and prevents the support frame from discretionarily pivoting.

7. The cassette for loading a substrate according to claim 1, wherein the first fixing unit and the second fixing unit are respectively formed with a pivot shaft and an insertion hole for the pivot shaft, and assembled to be pivotable with respect to each other.

\* \* \* \* \*